United States Patent
Rieschl et al.

(10) Patent No.: US 9,202,592 B2
(45) Date of Patent: Dec. 1, 2015

(54) SYSTEMS AND METHODS FOR MEMORY MANAGEMENT IN A DYNAMIC TRANSLATION COMPUTER SYSTEM

(71) Applicants: Michael Rieschl, Roseville, MN (US); James Merten, Roseville, MN (US); Brian Garrett, Salt Lake City, UT (US); Steven Bernardy, Roseville, MN (US)

(72) Inventors: Michael Rieschl, Roseville, MN (US); James Merten, Roseville, MN (US); Brian Garrett, Salt Lake City, UT (US); Steven Bernardy, Roseville, MN (US)

(73) Assignee: Unisys Corporation, Blue Bell, PA (US)

( * ) Notice: Subject to any disclaimer, the term of this patent is extended or adjusted under 35 U.S.C. 154(b) by 80 days.

(21) Appl. No.: 14/143,039

(22) Filed: Dec. 30, 2013

(65) Prior Publication Data

US 2015/0187435 A1    Jul. 2, 2015

(51) Int. Cl.
*G11C 29/00* (2006.01)
*G11C 29/10* (2006.01)
*G11C 29/04* (2006.01)

(52) U.S. Cl.
CPC ........ *G11C 29/10* (2013.01); *G11C 2029/0401* (2013.01)

(58) Field of Classification Search
None
See application file for complete search history.

(56) References Cited

U.S. PATENT DOCUMENTS

| | | | |
|---|---|---|---|
| 5,498,990 A * | 3/1996 | Leung et al. | 327/323 |
| 5,831,467 A * | 11/1998 | Leung et al. | 327/319 |
| 6,415,408 B1 * | 7/2002 | Rhodes et al. | 714/738 |
| 2002/0194421 A1* | 12/2002 | Berry et al. | 711/100 |
| 2008/0155246 A1* | 6/2008 | Jennings et al. | 713/2 |

* cited by examiner

*Primary Examiner* — Daniel McMahon
(74) *Attorney, Agent, or Firm* — Richard J. Gregson

(57) ABSTRACT

Systems and methods for managing memory in a dynamic translation computer system are provided. Embodiments may include receiving an instruction packet and processing the instruction packet. The instruction packet may include one or more instructions for obtaining a block of virtual memory for use in an emulated operating environment from a slab of virtual memory in a host environment, maintaining a mapping between the block of virtual memory and physical memory when the block is returned to the host environment, and for filling the block of virtual memory with zeros and a pattern based, at least in part, on a detected fill type.

15 Claims, 6 Drawing Sheets

SYSTEMS AND METHODS FOR MEMORY MANAGEMENT IN A DYNAMIC TRANSLATION COMPUTER SYSTEM

FIELD OF THE DISCLOSURE

The instant disclosure relates to computer systems. More specifically, this disclosure relates to memory management in computer systems that use dynamic translation.

BACKGROUND

Computer networks have become backbones of companies throughout the world. Even if a company does not provide products or services over the Internet, computer networks within the company improve employee productivity by providing employees with instantaneous access to millions of bytes of data, which may contain documents describing company operations or products or services offered by the company. To provide the instantaneous access to the data stored in memory, the instruction processors that manage memory access must operate quickly and efficiently. However, several operations in conventional systems, such as inter-processor timer interrupts, translation look-aside buffer flushes, and page faults, interrupt the instruction processors causing them to stall. To improve performance it is imperative that the frequency of the operations that cause instruction processor stalls be reduced.

SUMMARY

The performance of instruction processors (IPs) may be improved by improving the management of memory, such as by reducing the frequency of memory access operations that cause instruction processors to stall. According to one embodiment, a method may include obtaining a block of virtual memory for use in an emulated operating environment from a slab of virtual memory in a host environment, and maintaining a mapping between the block of virtual memory and physical memory upon returning the block of virtual memory to the slab of virtual memory. According to another embodiment, a computer program product may include a non-transitory computer-readable medium comprising code to perform the steps of obtaining a block of virtual memory for use in an emulated operating environment from a slab of virtual memory in a host environment, and maintaining a mapping between the block of virtual memory and physical memory upon returning the block of virtual memory to the slab of virtual memory. According to yet another embodiment, an apparatus may include a memory, and a processor coupled to the memory. The processor may be configured to execute the steps of obtaining a block of virtual memory for use in an emulated operating environment from a slab of virtual memory in a host environment, and maintaining a mapping between the block of virtual memory and physical memory upon returning the block of virtual memory to the slab of virtual memory.

In another embodiment, a method may include obtaining a block of virtual memory for use in an emulated operating environment from a slab of virtual memory in a host environment, detecting a fill type of the block of virtual memory, and filling the block of virtual memory with zeros and a pattern based, at least in part, on the detected fill type. According to yet another embodiment, a computer program product may include a non-transitory computer-readable medium comprising code to perform the steps obtaining a block of virtual memory for use in an emulated operating environment from a slab of virtual memory in a host environment, detecting a fill type of the block of virtual memory, and filling the block of virtual memory with zeros and a pattern based, at least in part, on the detected fill type. In some embodiments, an apparatus may include a memory, and a processor coupled to the memory. The processor may be configured to execute the steps of obtaining a block of virtual memory for use in an emulated operating environment from a slab of virtual memory in a host environment, detecting a fill type of the block of virtual memory, and filling the block of virtual memory with zeros and a pattern based, at least in part, on the detected fill type.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
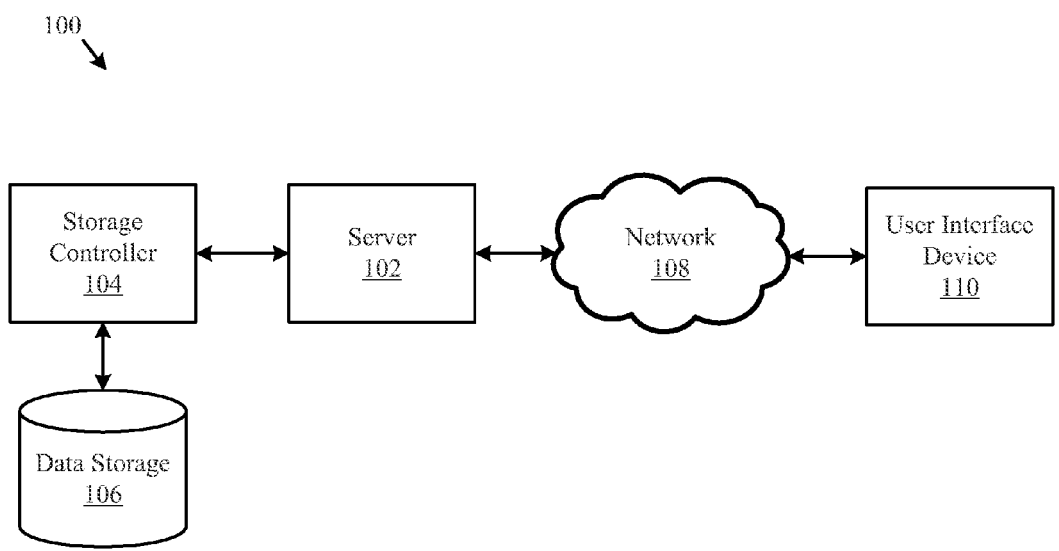
FIG. 1 is a block diagram illustrating a computer network according to one embodiment of the disclosure.

FIG. 1 illustrates one embodiment of a system 100 for managing memory in a computer system according to one embodiment of the disclosure. The system 100 may include a server 102, a data storage device 106, a network 108, and a user interface device 110. The server 102 may also be a hypervisor-based system executing one or more guest partitions hosting operating systems with modules having server configuration information. In a further embodiment, the system 100 may include a storage controller 104, or a storage server configured to manage data communications between the data storage device 106 and the server 102 or other components in communication with the network 108. In an alternative embodiment, the storage controller 104 may be coupled to the network 108.

In one embodiment, the user interface device 110 is referred to broadly and is intended to encompass a suitable (processor-based device such as a desktop computer, a laptop computer, a personal digital assistant (PDA) or tablet computer, a smartphone or other mobile communication device having access to the network 108. In a further embodiment, the user interface device 110 may access the Internet or other wide area or local area network to access a web application or web service hosted by the server 102 and may provide a user interface for enabling a user to enter or receive information.

The network 108 may facilitate communications of data between the server 102 and the user interface device 110. The network 108 may include any type of communications network including, but not limited to, a direct PC-to-PC connection, a local area network (LAN), a Wide area network (WAN), a modem-to-modem connection, the Internet, a combination of the above, or any other communications network now known or later developed within the networking arts which permits two or more computers to communicate.

Figure 2:
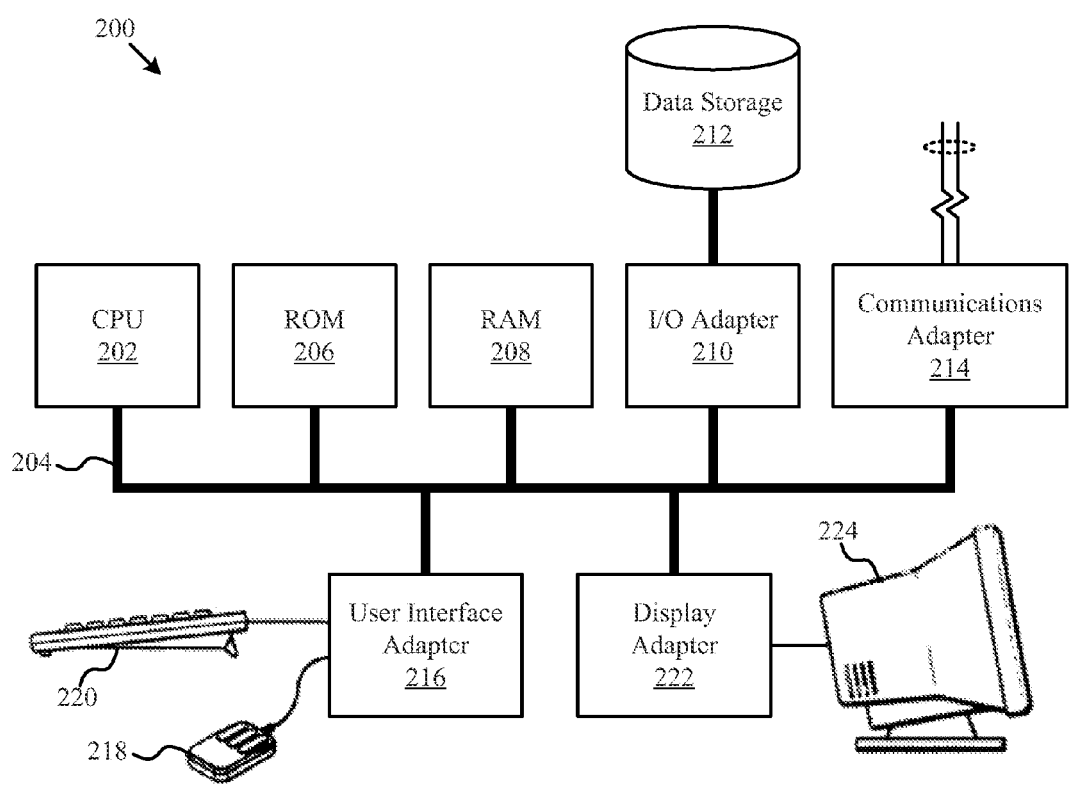
FIG. 2 is a block diagram illustrating a computer system according to one embodiment of the disclosure.

FIG. 2 illustrates a computer system 200 adapted according to certain embodiments of the server 102 and/or the user interface device 110. The central processing unit ("CPU") 202 is coupled to the system bus 204. The CPU 202 may be a general purpose CPU or microprocessor, graphics processing unit ("GPU"), and/or microcontroller. The present embodiments are not restricted by the architecture of the CPU 202 so long as the CPU 202, whether directly or indirectly, supports the operations as described herein. The CPU 202 may execute the various logical instructions according to the present embodiments.

The computer system 200 may also include random access memory (RAM) 208, which may be synchronous RAM (SRAM), dynamic RAM (DRAM), synchronous dynamic RAM (SDRAM), or the like. The computer system 200 may utilize RAM 208 to store the various data structures used by a software application. The computer system 200 may also include read only memory (ROM) 206 which may be PROM, EPROM, EEPROM, optical storage, or the like. The ROM may store configuration information for booting the computer system 200. The RAM 208 and the ROM 206 hold user and system data, and both the RAM 208 and the ROM 206 may be randomly accessed.

The computer system 200 may also include an input/output (I/O) adapter 210, a communications adapter 214, a user interface adapter 216, and a display adapter 222. The I/O adapter 210 and/or the user interface adapter 216 may, in certain embodiments, enable a user to interact with the computer system 200. In a further embodiment, the display adapter 222 may display a graphical user interface (GUI) associated with a software or web-based application on a display device 224, such as a monitor or touch screen.

The I/O adapter 210 may couple one or more storage devices 212, such as one or more of a hard drive, a solid state storage device, a flash drive, a compact disc (CD) drive, a floppy disk drive, and a tape drive, to the computer system 200. According to one embodiment, the data storage 212 may be a separate server coupled to the computer system 200 through a network connection to the I/O adapter 210. The communications adapter 214 may be adapted to couple the computer system 200 to the network 108, which may be one or more of a LAN, WAN, and/or the Internet. The user interface adapter 216 couples user input devices, such as a keyboard 220, a pointing device 218, and/or a touch screen (not shown) to the computer system 200. The display adapter 222 may be driven by the CPU 202 to control the display on the display device 224. Any of the devices 202-222 may be physical and/or logical.

The applications of the present disclosure are not limited to the architecture of computer system 200. Rather the computer system 200 is provided as an example of one type of computing device that may be adapted to perform the functions of the server 102 and/or the user interface device 110. For example, any suitable processor-based device may be utilized including, without limitation, personal data assistants (PDAs), tablet computers, smartphones, computer game consoles, and multi-processor servers. Moreover, the systems and methods of the present disclosure may be implemented on application specific integrated circuits (ASIC), very large scale integrated (VLSI) circuits, or other circuitry. In fact, persons of ordinary skill in the art may utilize any number of suitable structures capable of executing logical operations according to the described embodiments. For example, the computer system 200 may be virtualized for access by multiple users and/or applications.

Figure 3A:
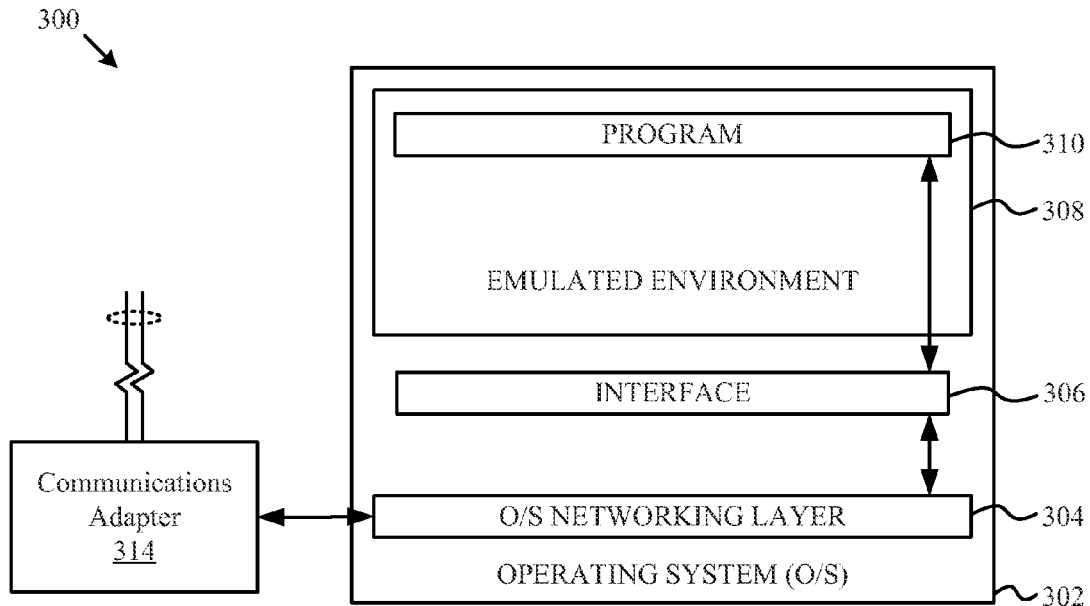
FIG. 3A is a block diagram illustrating a server hosting an emulated software environment for virtualization according to one embodiment of the disclosure.

FIG. 3A is a block diagram illustrating a server hosting an emulated software environment for virtualization according to one embodiment of the disclosure. An operating system 302 executing on a server includes drivers for accessing hardware components, such as a networking layer 304 for accessing the communications adapter 314. The operating system 302 may be, for example, Linux or Windows. An emulated environment 308 in the operating system 302 executes a program 310, such as Communications Platform (CPComm) or Communications Platform for Open Systems (CPCommOS). The program 310 accesses the networking layer 304 of the operating system 302 through a non-emulated interface 306, such as extended network input output processor (XNIOP). The non-emulated interface 306 translates requests from the program 310 executing in the emulated environment 308 for the networking layer 304 of the operating system 302.

Figure 3B:
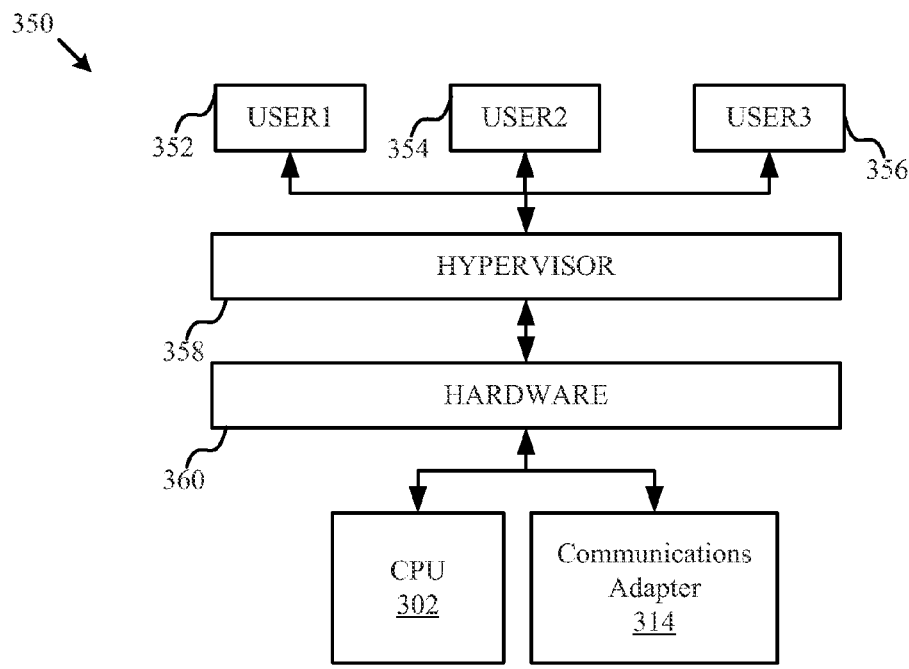
FIG. 3B is a block diagram illustrating a server hosting an emulated hardware environment according to one embodiment of the disclosure.

In another example, hardware in a computer system may be virtualized through a hypervisor. FIG. 3B is a block diagram illustrating a server hosting an emulated hardware environment according to one embodiment of the disclosure. Users 352, 354, 356 may access the hardware 360 through a hypervisor 358. The hypervisor 358 may be integrated with the hardware 360 to provide virtualization of the hardware 360 without an operating system, such as in the configuration illustrated in FIG. 3A. The hypervisor 358 may provide access to the hardware 360, including the CPU 302 and the communications adaptor 314.

Figure 4:
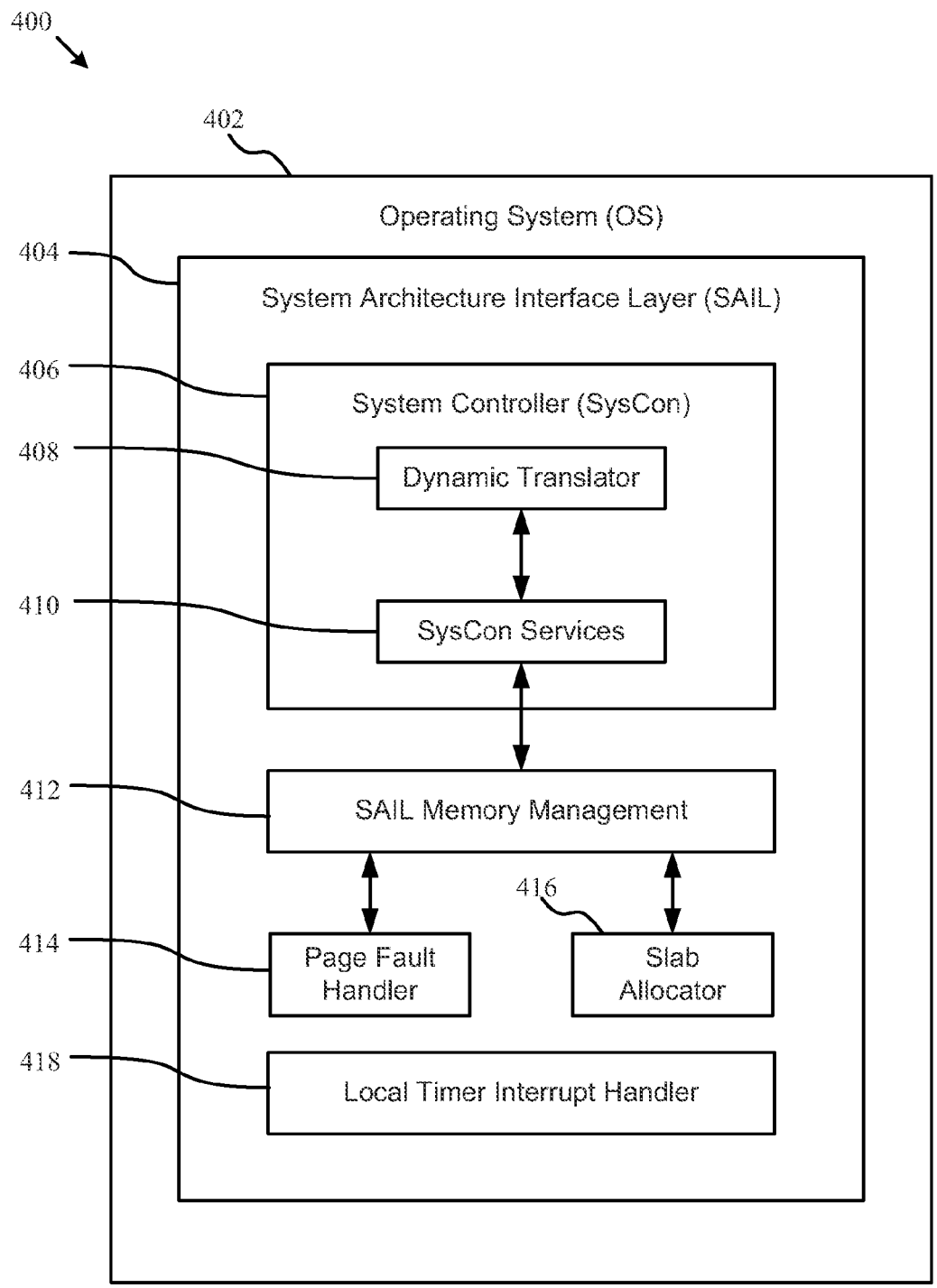
FIG. 4 is a block diagram illustrating a computer system according to one embodiment of the disclosure.

FIG. 4 illustrates one embodiment of a computer system 400, such as server 102 of FIG. 1, for managing memory in a dynamic translation computer system according to one embodiment of the disclosure. An operating system 402, which may be, for example, Linux, Windows, Java, Unix, or the like, may execute on a server and include drivers for accessing hardware components. System Architecture Interface Layer (SAIL) 404 may be the interface between the operating system 402 executing on a server and an operating environment, thereby providing the underlying operating system on which an operating environment executes. In some embodiments, SAIL 404 may include the operating system 402 and the layer in which the operating environment executes. SAIL 404 may include a System Control layer (SysCon) 406. In some embodiments, SysCon 406 may be responsible for loading and initializing instruction processors in the computer system 400. According to another embodiment, SysCon 406 may also acquire and initialize the initial memory area used by the operating environment and pass a pointer to the initial memory area to instruction processor emulators during a computer startup.

According to an embodiment, SysCon 406 may include a dynamic translator 408 that may emulate an operating environment instruction processor with an operating system 402 instruction processor that executes on the server. The dynamic translator 408 may define an intermediate instruction architecture that is more compatible with an emulator. As a result, the dynamic translator 408 may dynamically translate instructions associated with the operating environment to instructions associated with the intermediate instruction architecture, and implement an emulator that emulates the intermediate instruction architecture and executes the intermediate instructions on the server.

In some embodiments, the dynamic translator 408 may also include functionality to allocate blocks of virtual memory from a virtual memory slab for use by the dynamic translator 408. For example, blocks of virtual memory may be taken from the slab, used by the dynamic translator 408, and returned to the slab, as is described in more detail below with reference to the SAIL 404 and its memory management functionality.

In addition to the dynamic translator 408, SysCon 406 may include a SysCon services interface 410 that may serve as the memory management interface between an operating environment and SAIL memory management 412 when the operating environment is executing on the dynamic translator 408. In one embodiment, SysCon services interface 410 may make access calls to SAIL 404 directly via the SAIL memory management 412 to process memory requests from the operating environment. For example, an operating environment instruction to be executed on the dynamic translator 408 may include a memory management instruction. In general, the operating environment may use memory management instructions to request and release memory allocations. The memory management instruction may be communicated as an instruction packet to SysCon services interface 410, and SysCon services interface 410 may receive and process the instruction packet. For example, the SysCon services interface 410 may check the instruction packet for errors. After processing the instruction packet, the SysCon services interface 410 may communicate the instruction packet to the SAIL memory management interface 412 to process the instruction packet on the server. Because the memory management instruction is an operating environment instruction executed with the emulated instruction processor but processed with the operating system instruction processors, the memory management instruction may be referred to as an inter-processor communication instruction and the instruction packet may be referred to as an inter-processor communication instruction packet.

According to one embodiment, the SAIL memory management mechanism 412, which may have direct control of memory on the server, may further process the instruction packet after being received from the SysCon services interface 410. Included within SAIL 410 for further processing may be a page fault handler 414 and a slab allocator 416. The page fault handler 414 may be used by SAIL 404 to reduce the number of page faults, thereby reducing the number stalls experienced in the computer system. The slab allocator 416 may be used by SAIL 404 to manage the allocation of a virtual memory slab when the instruction packet includes instructions for the virtual memory slab.

According to one embodiment, instructions included in the instruction packet may be processed by the slab allocator 416 included within SAIL 404 to obtain a block of virtual memory for use in an emulated operating environment, by the dynamic translator 408, from a slab of virtual memory in a host environment, such as the operating system 402 environment. When used by the dynamic translator 408, the obtained virtual block may be filled to represent a mapping between the block of virtual memory and physical memory. Upon returning the block of virtual memory to the slab of virtual memory, the mapping between the block of virtual memory and physical memory may be maintained.

In some embodiments, SAIL 404 may also include functionality and/or code to detect the fill pattern of the block of virtual memory such that maintaining the mapping between the block of virtual memory and physical memory may be based, at least in part, on the fill pattern of the block of virtual memory. SAIL 404 may also include functionality and/or code for re-initializing the mapping between virtual memory and physical memory based on one or more predefined fill patterns for the block of virtual memory which describe how a block of virtual memory can be filled, such as the detected fill pattern.

Instructions included in an instruction packet may also include instructions for reducing the number of whole-cache translation look-aside buffer flushes and for reducing inter-processor interrupts. Instructions included in the instruction packet for memory management may also include one or more instructions for clearing the mapping between the virtual memory block and physical memory and/or invalidating a translation look-aside buffer. For example, when physical memory occupancy reaches or exceeds a threshold percentage, the mapping between the block of virtual memory and physical memory may be cleared and one or more translation look-aside buffers may be invalidated.

In some embodiments, SAIL 404 may also include functionality and/or code for detecting the fill type of the block of virtual memory. For example, SAIL 404 may include functionality and/or code to detect when the block of virtual memory is partially filled, in which case the fill type may be a partial fill. The memory management instruction packet for execution by the dynamic translator 408 may also include one or more instructions for filling the block of virtual memory with zeros and a pattern based, at least in part, on the detected fill type. For example, when the fill type is detected to be a partial fill type, the block of virtual memory may be partially filled with zeros, and the remainder of the block may be filled with a pattern.

According to an embodiment, SAIL 404 may also include a local timer interrupt handler module 418 with functionality and/or code to handle local timer interrupts. In some embodiments, an initial SAIL 404 configuration may program local-timer interrupts to occur in order to update system activity statistics, timer-related events, a scheduler, and the like. However, to further reduce the number of stalls experienced in the computer system, the local interrupt handler module 418 may disable local-timer interrupts under certain circumstances. For example, when an operating system instruction processor is executing user code and forecasted timer-related events for the processor are substantially far enough into the future, the local-timer interrupts may be disabled to reduce instruction processor stalls. In another example, when an operating system instruction processor is in system mode (i.e., not executing user code) and the processor is idle, local timer interrupts may be used for statistical and monitoring purposes.

Figure 5:
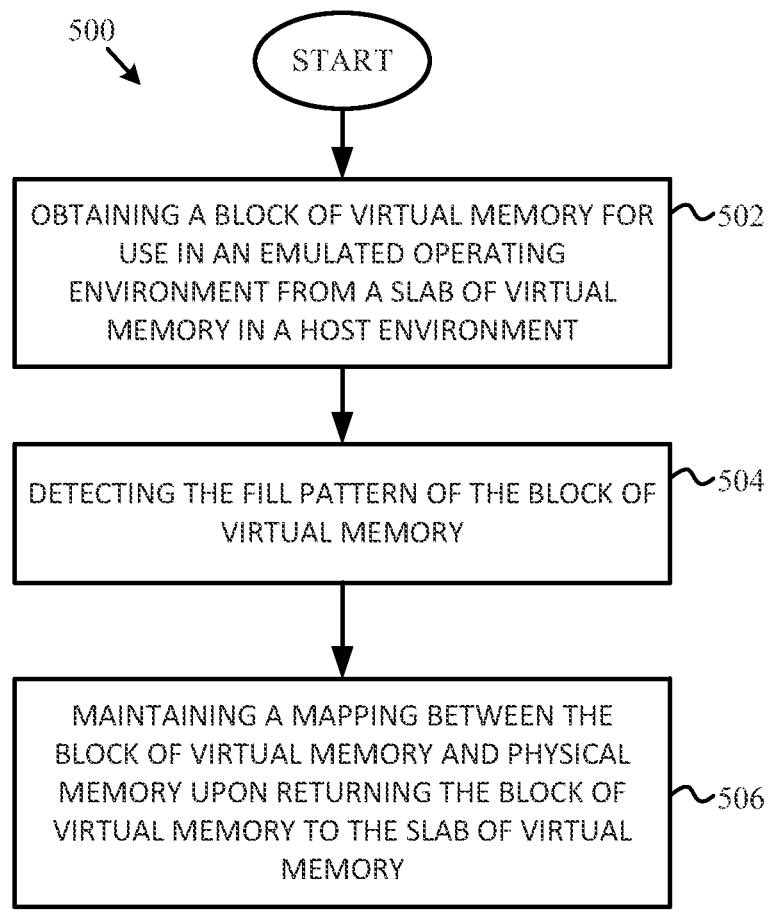
FIG. 5 is a flow chart illustrating a method of obtaining virtual memory for an emulated environment according to one embodiment of the disclosure.

FIG. 5 is a flow chart illustrating a method of obtaining virtual memory for an emulated environment according to one embodiment of the disclosure. A method 500 begins at block 502 with obtaining, by a processor, a block of virtual memory for use in an emulated operating environment from a slab of virtual memory in a host environment executing the emulated operating environment. At block 504, the processor may detect the fill pattern of the block of virtual memory. At block 506, the processor may maintain a mapping between the block of virtual memory and physical memory upon returning the block of virtual memory to the slab of virtual memory. The step of maintaining the mapping between the block of virtual memory and physical memory may be based, at least in part, on the fill pattern of the block of virtual memory.

Figure 6:
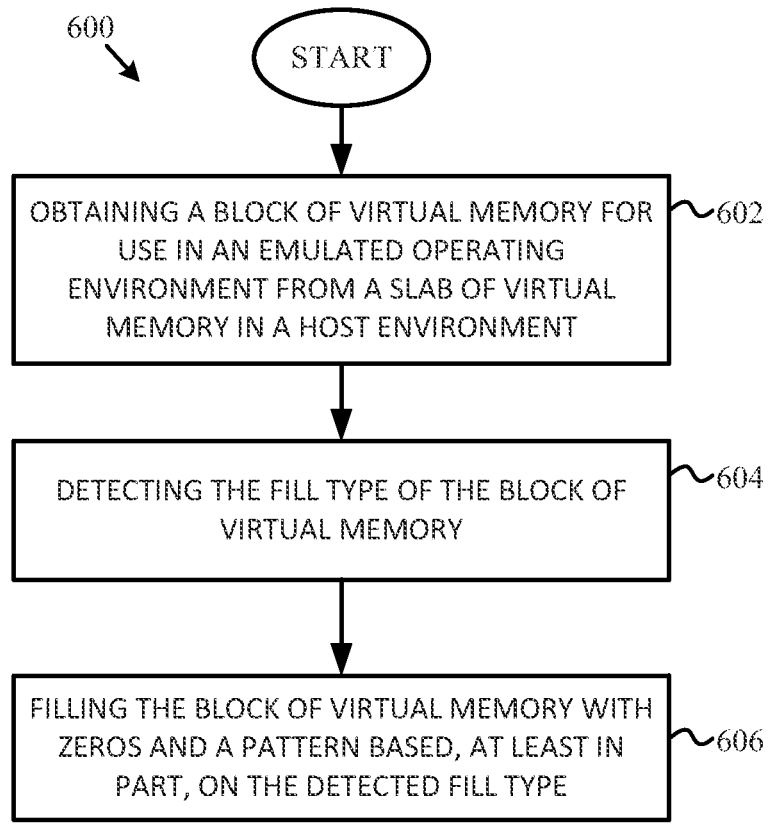
FIG. 6 is a flow chart illustrating a method of filling a block of virtual memory according to one embodiment of the disclosure.

FIG. 6 is a flow chart illustrating a method of filling a block of virtual memory according to one embodiment of the disclosure. A method 600 may begin at block 602 with obtaining, by a processor, a block of virtual memory for use in an emulated operating environment from a slab of virtual memory in a host environment. At block 604, the processor may detect the fill type of the block of virtual memory. At block 606, the processor may fill the block of virtual memory with zeros and a pattern based, at least in part, on the detected fill type.

If implemented in firmware and/or software, the functions described above, such as in FIG. 5 and FIG. 6, may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
   obtaining, by a processor, a block of virtual memory for use in an emulated operating environment from a slab of virtual memory in a host environment;
   detecting, by the processor, a fill type of the block of virtual memory;
   filling, by the processor, the block of virtual memory with zeros and a pattern based, at least in part, on the fill type; and
   disabling, by the processor, local-timer interrupts;
   wherein the step of disabling may occur before or after the step of obtaining, detecting, or filling.

2. The method of claim 1, wherein the fill type of the block of virtual memory is a partial fill.

3. The method of claim 2, wherein filling the block of virtual memory comprises partially filling the block of virtual memory with zeros, and filling the remainder of the block of virtual memory with the pattern when the fill type is detected to be a partial fill.

4. The method of claim 1, further comprising receiving an inter-processor communication instruction packet, wherein the step of obtaining is initiated after receipt of the inter-processor communication instruction packet.

5. The method of claim 4, further comprising checking the inter-processor communication instruction packet for errors.

6. A computer program product, comprising:
   a non-transitory computer-readable medium comprising code to perform the steps of:
      obtaining a block of virtual memory for use in an emulated operating environment from a slab of virtual memory in a host environment;
      detecting a fill type of the block of virtual memory;
      filling the block of virtual memory with zeros and a pattern based, at least in part, on the fill type; and
      disabling local-timer interrupts;
      wherein the step of disabling may occur before or after the step of obtaining, detecting, or filling.

7. The computer program product of claim 6, wherein the fill type of the block of virtual memory is a partial fill.

8. The computer program product of claim 7, wherein filling the block of virtual memory comprises partially filling the block of virtual memory with zeros, and filling the remainder of the block of virtual memory with the pattern when the fill type is detected to be a partial fill.

9. The computer program product of claim 6, wherein the medium further comprises code to perform the step of receiving an inter-processor communication instruction packet, wherein the step of obtaining is initiated after receipt of the inter-processor communication instruction packet.

10. The computer program product of claim 9, wherein the medium further comprises code to perform the step of checking the inter-processor communication instruction packet for errors.

11. An apparatus, comprising:
    a memory; and
    a processor coupled to the memory, the processor configured to execute the steps of:
       obtaining a block of virtual memory for use in an emulated operating environment from a slab of virtual memory in a host environment;
       detecting a fill type of the block of virtual memory;
       filling the block of virtual memory with zeros and a pattern based, at least in part, on the fill type; and
       disabling local-timer interrupts;

wherein the step of disabling may occur before or after the step of obtaining, detecting, or filling.

12. The apparatus of claim 11, wherein the fill type of the block of virtual memory is a partial fill.

13. The apparatus of claim 12, wherein filling the block of virtual memory comprises partially filling the block of virtual memory with zeros, and filling the remainder of the block of virtual memory with the pattern when the fill type is detected to be a partial fill.

14. The apparatus of claim 11, in which the processor is further configured to perform the step of receiving an inter-processor communication instruction packet, wherein the step of obtaining is initiated after receipt of the inter-processor communication instruction packet.

15. The apparatus of claim 14, in which the processor is further configured to perform the step of checking the inter-processor communication instruction packet for errors.

* * * * *